US012453047B2

(12) United States Patent
Hano

(10) Patent No.: US 12,453,047 B2
(45) Date of Patent: Oct. 21, 2025

(54) ELECTRIC APPARATUS

(71) Applicant: TOSHIBA MITSUBISHI-ELECTRIC INDUSTRIAL SYSTEMS CORPORATION, Chuo-ku (JP)

(72) Inventor: Mitsuru Hano, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 18/253,249

(22) PCT Filed: Oct. 11, 2021

(86) PCT No.: PCT/JP2021/037541
§ 371 (c)(1),
(2) Date: May 17, 2023

(87) PCT Pub. No.: WO2023/062674
PCT Pub. Date: Apr. 20, 2023

(65) Prior Publication Data
US 2024/0373587 A1 Nov. 7, 2024

(51) Int. Cl.
*H05K 7/20* (2006.01)
(52) U.S. Cl.
CPC ................ *H05K 7/20272* (2013.01)
(58) Field of Classification Search
CPC .................................................. H05K 7/20272
USPC .......................................................... 361/699
See application file for complete search history.

(56) References Cited

U.S. PATENT DOCUMENTS

| 2009/0250195 A1* | 10/2009 | Yoshida | H01L 23/473 |
| | | | 361/702 |
| 2014/0252590 A1* | 9/2014 | Gohara | H01L 23/473 |
| | | | 257/715 |
| 2020/0258815 A1* | 8/2020 | Suzuki | F28F 13/06 |

FOREIGN PATENT DOCUMENTS

| JP | 6-2959 A | 1/1994 | |
| JP | 2004-274959 A | 9/2004 | |
| JP | 2005-229047 A | 8/2005 | |
| JP | 2006-86503 A | 3/2006 | |
| JP | 2006-261555 A | 9/2006 | |
| JP | 2019-46944 A | 3/2019 | |
| JP | 2019046944 A * | 3/2019 | ........... H01L 23/473 |
| JP | 2019-160849 A | 9/2019 | |

OTHER PUBLICATIONS

International Search Report mailed on Nov. 16, 2021 in PCT/JP2021/037541 filed on Oct. 11, 2021, 6 pages (with English translation).

* cited by examiner

*Primary Examiner* — Zhengfu J Feng
(74) *Attorney, Agent, or Firm* — Oblon, McClelland, Maier &Neustadt, L.L.P.

(57) ABSTRACT

A cooler of an embodiment includes a contact surface, a flow path formation portion, a supply portion, a discharge portion, and at least one retention portion. The contact surface is in contact with a cooling target object. A flow path through which a refrigerant flows is formed in the flow path formation portion. The supply portion supplies the refrigerant to the flow path. The discharge portion discharges the refrigerant from the flow path. The retention portion changes a flow path cross-sectional area so as to promote retention of the refrigerant locally in the flow path.

2 Claims, 5 Drawing Sheets

ELECTRIC APPARATUS

TECHNICAL FIELD

An embodiment of the present invention relates to a cooler and an electric apparatus.

BACKGROUND

In the related art, an electric power conversion device is known which includes a heat sink in which a flow path allowing a liquid refrigerant such as water to flow therethrough is formed.

However, when increasing a flow velocity or a flow rate of the refrigerant in order to increase the cooling capacity of the heat sink, the device may become large, or an abnormality in the device may occur. For example, when increasing the flow rate of the refrigerant by enlarging a flow path cross-sectional area, the capacity of a pump that allows the refrigerant to flow may be increased. For example, when increasing the flow velocity of the refrigerant, an abnormality such as damage may occur inside the flow path.

RELATED ART DOCUMENTS

Patent Documents

[Patent Document 1]
Japanese Unexamined Patent Application, First Publication No. 2004-274959
[Patent Document 2]
Japanese Unexamined Patent Application, First Publication No. 2019-160849

SUMMARY OF INVENTION

Problems to be Solved by the Invention

A problem to be solved by the present invention is to provide a cooler and an electric apparatus capable of improving the cooling capability while preventing the size from increasing and preventing the occurrence of an abnormality.

Means for Solving the Problem

A cooler of an embodiment includes a contact surface, a flow path formation portion, a supply portion, a discharge portion, and at least one retention portion. The contact surface is in contact with a cooling target object. A flow path through which a refrigerant flows is formed in the flow path formation portion. The supply portion supplies the refrigerant to the flow path. The discharge portion discharges the refrigerant from the flow path. The retention portion changes a flow path cross-sectional area so as to promote retention of the refrigerant locally in the flow path.

DESCRIPTION OF THE EMBODIMENTS

Hereinafter, a cooler and an electric apparatus of an embodiment will be described with reference to the drawings.

Figure 1:
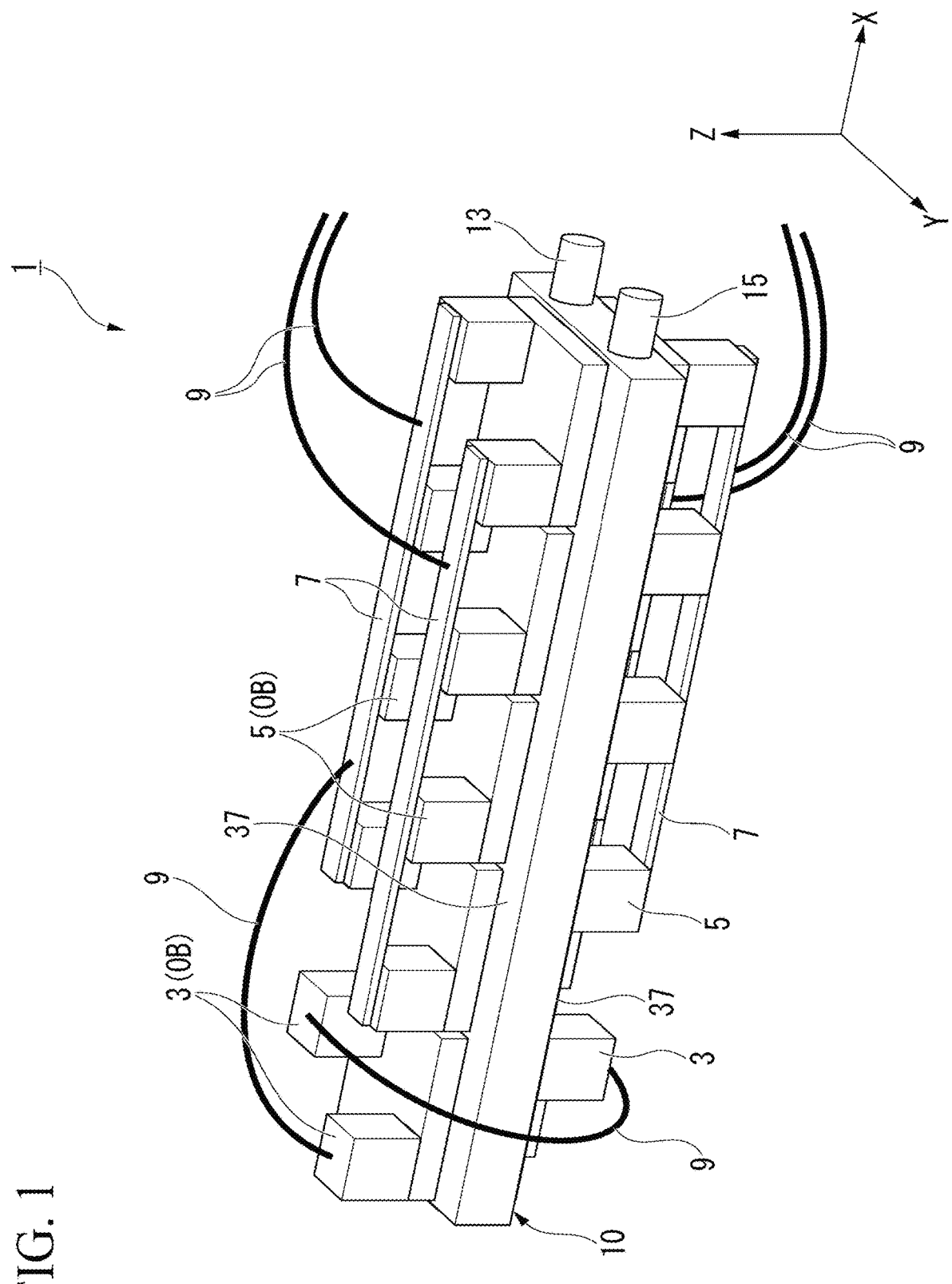
FIG. 1 is a perspective view showing a configuration of an electric apparatus that includes a cooler of an embodiment.
Figure 2:
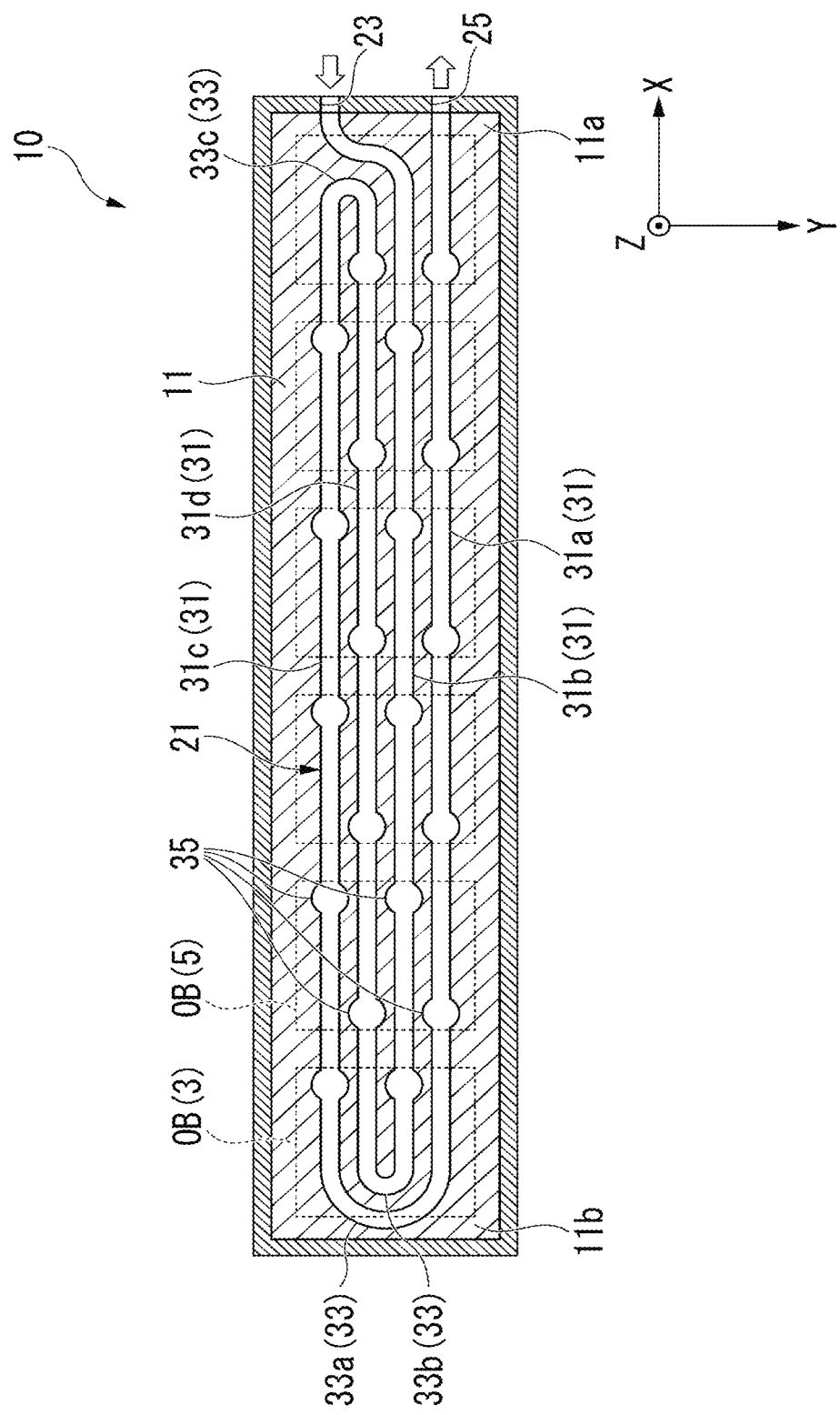
FIG. 2 is a cross-sectional view of the cooler of the embodiment.

FIG. 1 is a perspective view showing a configuration of an electric apparatus 1 that includes a cooler 10 of an embodiment. FIG. 2 is a cross-sectional view of the cooler 10 of the embodiment.

Hereinafter, each axis direction of the X-axis, the Y-axis, and the Z-axis orthogonal to one another in a three-dimensional space is a direction parallel to each axis of the device. For example, as shown in FIG. 1 and FIG. 2, the Z-axis direction is parallel to a thickness direction of the cooler 10. The Y-axis direction is parallel to a short direction of the cooler 10. The X-axis direction is parallel to a long direction of the cooler 10.

The electric apparatus 1 of the embodiment is, for example, a board provided on an electrical facility or the like. The board is a switchboard, a distribution board, a control board, and the like that constitute an electric power conversion apparatus, an electric power supply apparatus, a motor drive apparatus, and the like.

As shown in FIG. 1, the electric apparatus 1 includes, for example, a variety of circuit components such as a semiconductor element, a resistor, a conductor, a fuse, a capacitor, a transformer, a switch, a circuit breaker, and a measurement device. Among the variety of circuit components, for example, a heat source such as a semiconductor element and a resistor is a cooling target object OB that is cooled by the cooler 10.

In the electric apparatus 1 of the embodiment, for example, a plurality of discharge resistors 3 and a plurality of snubber resistors 5 are arranged on both sides in a thickness direction of the cooler 10 as a cooling target object OB. A generated heat of the discharge resistor 3 is relatively smaller than a generated heat of the snubber resistor 5 at the time of operation of the electric apparatus 1 or the like.

For example, at each of both sides in the thickness direction of the cooler 10, each of a positive electrode side and a negative electrode side of the plurality of snubber resistors 5 are connected to a bus bar 7. A suitable cable 9 is connected to each discharge resistor 3 and the plurality of discharge resistors 3 connected by each bus bar 7.

For example, the plurality of discharge resistors 3 and the plurality of snubber resistors 5 are arranged so as to be aligned in the X-axis direction in each of two rows along the X-axis direction and such that the two lows are displaced from each other in the X-axis direction. The plurality of discharge resistors 3 and the plurality of snubber resistors 5 are arranged in a staggered arrangement when seen from the thickness direction of the cooler 10. The plurality of discharge resistors 3 and the plurality of snubber resistors 5 constitute one cooling target object OB by a pair of discharge resistors 3 or a pair of snubber resistors 5 arranged in a staggered manner.

The cooler 10 is, for example, a heat sink that cools a cooling target object by a refrigerant in a liquid state, a gas state, or the like that flows through the inside of the cooler 10. As shown in FIG. 1, the outer shape of the cooler 10 is, for example, a cuboid box shape. The cooler 10 includes a flow path formation portion 11, and a supply portion 13 and a discharge portion 15 that are in communication with the flow path formation portion 11.

As shown in FIG. 2, a flow path 21 through which a refrigerant flows at the inside of the cooler 10 is formed in the flow path formation portion 11. A refrigerant supply port 23 and a refrigerant discharge port 25 that allow the flow path 21 to be in communication with the outside of the cooler 10 are formed on the flow path formation portion 11. The refrigerant supply port 23 and the refrigerant discharge port 25 are formed, for example, at one end portion (a right end portion in FIG. 2, hereinafter referred to as a first end portion 11a) of both end portions in the X-axis direction of the flow path formation portion 11.

In the following description, a side of the first end portion 11a in the flow path formation portion 11 is simply referred to as a first end portion 11a side. Among both end portions in the X-axis direction of the flow path formation portion 11, an end portion (a left end portion in FIG. 2) on the opposite side of the first end portion 11a is referred to as a second end portion 11b. A side of the second end portion 11b in the flow path formation portion 11 is simply referred to as a second end portion 11b side.

The flow path 21 reciprocates along the X-axis direction, for example, a plurality of times between both end portions in the X-axis direction of the flow path formation portion 11. The flow path 21 is provided toward a circumferential edge portion from a middle portion in the Y-axis direction while meandering between both end portions in the X-axis direction of the flow path formation portion 11. The flow path 21 includes, for example, a plurality of straight-line-shape portions 31, a plurality of curved portions 33 joined to both ends in a longitudinal direction of the plurality of straight-line-shape portions 31, and a plurality of retention portions 35 provided in the middle of the straight-line-shape portion 31.

The plurality of straight-line-shape portions 31 are, for example, four straight-line-shape portions 31 (a first outer straight-line-shape portion 31a, a first inner straight-line-shape portion 31b, a second outer straight-line-shape portion 31c, a second inner straight-line-shape portion 31d). Each of the plurality of straight-line-shape portions 31 is provided so as to extend parallel along the X-axis direction between both end portions in the X-axis direction of the flow path formation portion 11. The plurality of straight-line-shape portions 31 are provided, for example, to be aligned along the Y-axis direction.

Among the straight-line-shape portions 31, the refrigerant discharge port 25 is connected to the first end portion 11a side of the first outer straight-line-shape portion 31a provided on one end portion in the Y-axis direction. The refrigerant supply port 23 is connected to the first end portion 11a side of the first inner straight-line-shape portion 31b aligned in the Y-axis direction with the first outer straight-line-shape portion 31a.

The plurality of curved portions 33 are, for example, three curved portions 33 (a first curved portion 33a, a second curved portion 33b, a third curved portion 33c). Each of the plurality of curved portions 33 is arranged, for example, at either of both end portions in the X-axis direction of the flow path formation portion 11. Each curved portion 33 is formed in a U shape so as to protrude outward in the X-axis direction of the flow path formation portion 11. Both ends of each curved portion 33 are connected to an end in the X-axis direction of a predetermined straight-line-shape portion 31.

For example, the first curved portion 33a among the three curved portions 33 connects the second end portion 11b side of the first outer straight-line-shape portion 31a to the second end portion 11b side of the second outer straight-line-shape portion 31c provided at an end on the opposite side of the first outer straight-line-shape portion 31a in the Y-axis direction.

The second curved portion 33b among the three curved portions 33 connects the second end portion 11b side of the first inner straight-line-shape portion 31b to the second end portion 11b side of the second inner straight-line-shape portion 31d provided between the first inner straight-line-shape portion 31b and the second outer straight-line-shape portion 31c.

The third curved portion 33c among the three curved portions 33 connects the first end portion 11a side of the second outer straight-line-shape portion 31c to the first end portion 11a side of the second inner straight-line-shape portion 31d.

Thereby, the flow path 21 is provided toward the circumferential edge portion from the middle portion in the Y-axis direction while meandering between both end portions in the X-axis direction of the flow path formation portion 11.

Each of the plurality of retention portions 35 is provided, for example, such that a flow path cross-sectional area is changed so as to promote retention of the refrigerant locally in the straight-line-shape portion 31 of the flow path 21. A flow path cross-sectional area of each retention portion 35 is formed, for example, to be larger than a flow path cross-sectional area of the straight-line-shape portion 31. Each retention portion 35 is formed, for example, to be enlarged in the Y-axis direction as compared to the straight-line-shape portion 31.

A retention time of the refrigerant in each retention portion 35 is smaller than a retention time of the refrigerant in the straight-line-shape portion 31. The retention time is, for example, a time required for the refrigerant to flow through a unit length along the X-axis direction of the flow path 21.

A plurality of retention portions 35 provided in any two straight-line-shape portions 31 adjacent in the Y-axis direction among the plurality of straight-line-shape portions 31 are arranged, for example, in a staggered arrangement when seen from the Z-axis direction. In any two straight-line-shape portions 31 adjacent in the Y-axis direction, the distance between one straight-line-shape portion 31 and the retention portion 35 is smaller than a distance between two straight-line-shape portions 31.

Each of the plurality of retention portions 35 is provided, for example, so as to overlap the cooling target object OB of the electric apparatus 1 when seen from a normal direction of a contact surface 37 of the cooler 10 described later. The normal direction of the contact surface 37 is parallel to the thickness direction of the cooler 10 and is, for example, the Z-axis direction.

In such a configuration, for example, the flow path 21 from the refrigerant supply port 23 to the refrigerant discharge port 25 at the inside of the cooler 10 is first provided from the refrigerant supply port 23 toward a middle section in the Y-axis direction of the flow path formation portion 11. Next, the flow path 21 is provided from the middle section of the flow path formation portion 11 toward a circumferential edge section (both end sections) in the Y-axis direction. Next, the flow path 21 is provided from the circumferential edge section of the flow path formation portion 11 toward the refrigerant discharge port 25.

Each of the supply portion 13 and the discharge portion 15 constitutes, for example, a connection portion for connecting to a piping that communicates with each of the refrigerant supply port 23 and the refrigerant discharge port 25 or the like.

As shown in FIG. 1, the cooler 10 includes, for example, at both sides in the thickness direction, the contact surface 37 on which a plurality of cooling target objects OB are arranged. The plurality of cooling target objects OB are arranged, for example, to be aligned in a line in the X-axis direction on each contact surface 37 along the straight-line-shape portion 31 of the flow path 21. Among the plurality of cooling target objects OB on each contact surface 37, a cooling target object OB having a relatively large heat generation amount is arranged closer to the supply portion 13 and the discharge portion 15 in the X-axis direction than a cooling target object OB having a relatively small heat generation amount.

For example, a cooling target object OB constituted of a pair of discharge resistors 3 having a relatively small heat generation amount is arranged further away from the supply portion 13 and the discharge portion 15 than a cooling target object OB constituted of a pair of discharge resistors 3 having a relatively small heat generation amount. For example, as shown in FIG. 2, the cooling target object OB constituted of the pair of discharge resistors 3 is arranged at the second end portion 11b on the opposite side of the first end portion 11a in the X-axis direction of the flow path formation portion 11 at which the refrigerant supply port 23 and the refrigerant discharge port 25 are provided.

Figure 3:
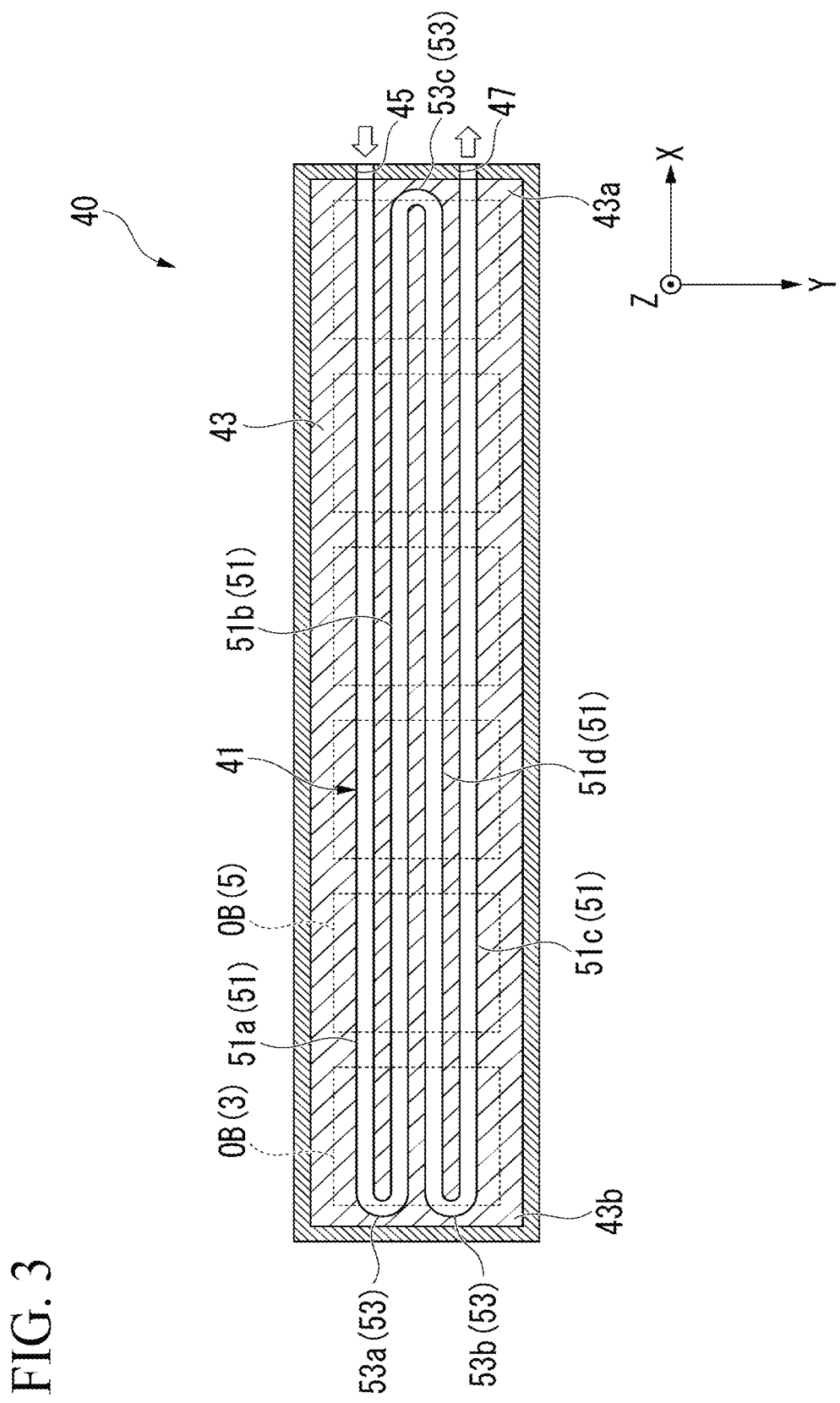
FIG. 3 is a cross-sectional view of a cooler according to a comparison example of the embodiment.
Figure 4:
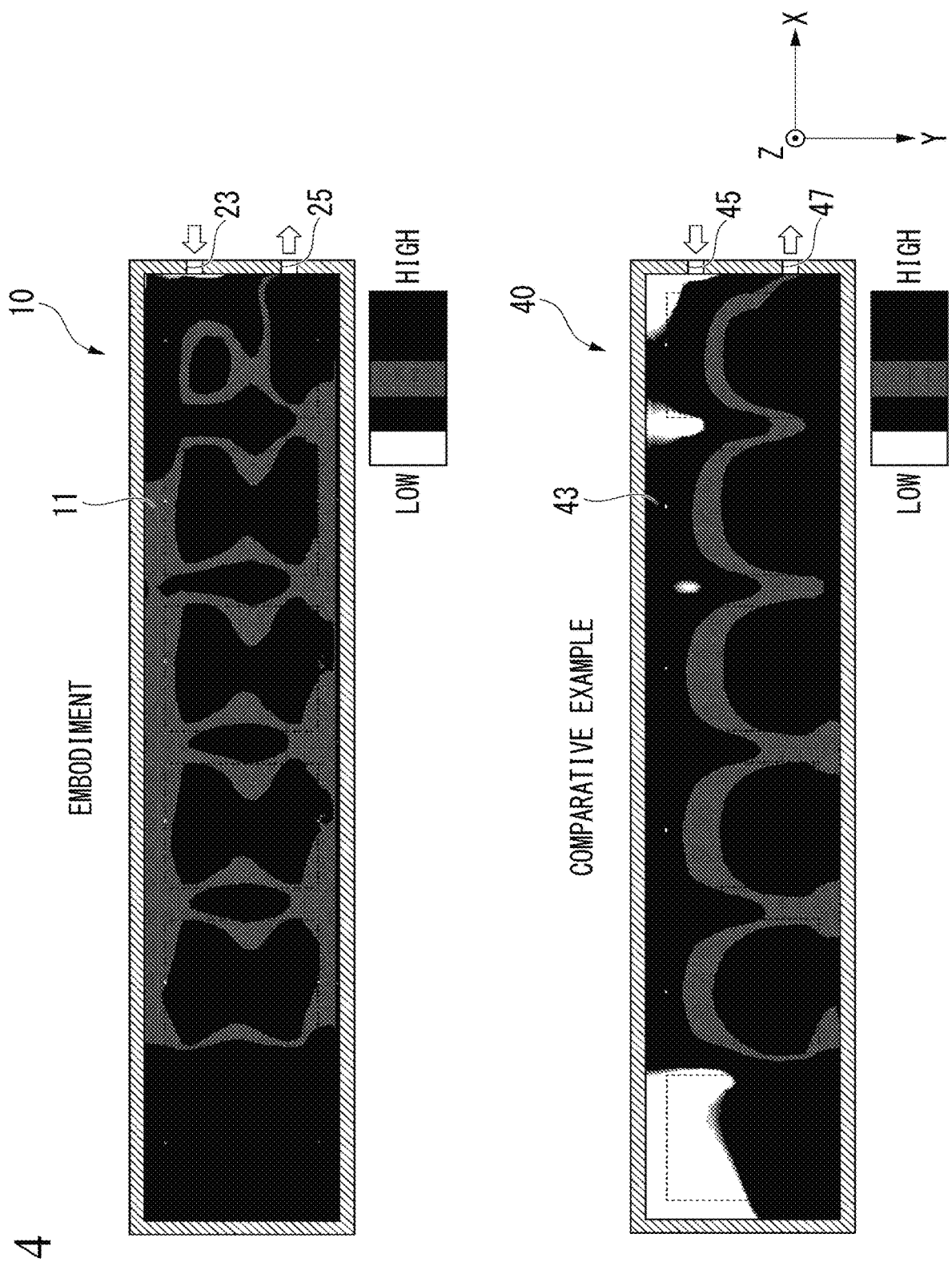
FIG. 4 is a view showing an example of a temperature distribution of each of the cooler of the embodiment and the cooler of the comparison example.

FIG. 3 is a cross-sectional view of a cooler 40 according to a comparison example of the embodiment. FIG. 4 is a view showing an example of a temperature distribution of each of the cooler 10 of the embodiment and the cooler 40 of the comparison example.

The outer shape of the cooler 40 of the comparison example is identical to the outer shape of the cooler 10 of the embodiment. The arrangement of the plurality of cooling target objects OB in the cooler 40 of the comparison example is identical to the arrangement of the plurality of cooling target objects OB in the cooler 10 of the embodiment.

As shown in FIG. 3, the difference between the cooler 40 according to the comparison example of the embodiment and the cooler 10 of the embodiment described above is that a flow path 41 of the cooler 40 of the comparison example is different from the flow path 21 of the cooler 10 of the embodiment. The difference between the cooler according to the comparison example of the embodiment and the cooler 10 of the embodiment described above is that the retention portion 35 provided in the flow path 21 of the cooler 10 of the embodiment is not provided in the cooler 40 of the comparison example.

That is, the cooler 40 of the comparison example includes a flow path formation portion 43 in which a flow path 41 through which the refrigerant flows is formed. The outer shape of the flow path formation portion 43 of the comparison example is identical to the outer shape of the flow path formation portion 11 of the embodiment. A refrigerant supply port 45 and a refrigerant discharge port 47 that allow the flow path 41 to be in communication with the outside of the cooler 40 are formed on the flow path formation portion 43 of the comparison example. The refrigerant supply port 45 and the refrigerant discharge port 47 are formed, for example, at one end portion (a right end portion in FIG. 3, hereinafter referred to as a first end portion 43a) of both end portions in the X-axis direction of the flow path formation portion 43.

In the following description, a side of the first end portion 43a in the flow path formation portion 43 is simply referred to as a first end portion 43a side. Among both end portions in the X-axis direction of the flow path formation portion 43, an end portion (a left end portion in FIG. 3) on the opposite side of the first end portion 43a is referred to as a second end portion 43b. A side of the second end portion 43b in the flow path formation portion 43 is simply referred to as a second end portion 43b side.

The flow path 43 reciprocates along the X-axis direction, for example, a plurality of times between both end portions in the X-axis direction of the flow path formation portion 43. The flow path 41 is provided from one side (an upper side in FIG. 3, hereinafter referred to as a Y-axis direction upper side) in the Y-axis direction toward the opposite side (a lower side in FIG. 3, hereinafter referred to as a Y-axis direction lower side) while meandering between both end portions in the X-axis direction of the flow path formation portion 43. The flow path 41 includes, for example, a plurality of straight-line-shape portions 51 and a plurality of curved portions 53 joined to both ends in a longitudinal direction of the plurality of straight-line-shape portions 51.

The plurality of straight-line-shape portions 51 are, for example, four straight-line-shape portions 51 (a first outer straight-line-shape portion 51a, a first inner straight-line-shape portion 51b, a second outer straight-line-shape portion 51c, a second inner straight-line-shape portion 51d). Each of the plurality of straight-line-shape portions 51 is provided so as to extend parallel along the X-axis direction between both end portions in the X-axis direction of the flow path formation portion 11. The plurality of straight-line-shape portions 31 are provided, for example, to be aligned along the Y-axis direction.

Among the straight-line-shape portions 51, the refrigerant supply port 45 is connected to the first end portion 43a side of the first outer straight-line-shape portion 51a provided on an upper end in the Y-axis direction. Among the straight-line-shape portions 51, the refrigerant discharge port 47 is connected to the first end portion 43a side of the second outer straight-line-shape portion 51c provided on a lower end in the Y-axis direction.

The plurality of curved portions 53 are, for example, three curved portions 53 (a first curved portion 53a, a second curved portion 53b, a third curved portion 53c). Each of the plurality of curved portions 33 is arranged, for example, at either of both end portions in the X-axis direction of the flow path formation portion 43. Each curved portion 53 is formed in a U shape so as to protrude outward in the X-axis direction of the flow path formation portion 43. Both ends of each curved portion 53 are connected to an end in the X-axis direction of a predetermined straight-line-shape portion 51.

For example, the first curved portion 53a among the three curved portions 53 connects the second end portion 43b side of the first outer straight-line-shape portion 51a to the second end portion 43b side of the first inner straight-line-shape portion 51b adjacent to the first outer straight-line-shape portion 51a.

The second curved portion 53b among the three curved portions 53 connects the second end portion 43b side of the second outer straight-line-shape portion 51c to the second end portion 43b side of the second inner straight-line-shape portion 51d adjacent to the second outer straight-line-shape portion 51c.

The third curved portion 53c among the three curved portions 53 connects the first end portion 43a side of the first inner straight-line-shape portion 51b to the first end portion 43a side of the second inner straight-line-shape portion 51d.

Thereby, the flow path 41 is provided toward the Y-axis direction lower side from the Y-axis direction upper side while meandering between both end portions in the X-axis direction of the flow path formation portion 43.

In such a configuration, the flow path 41 from the refrigerant supply port 45 to the refrigerant discharge port 47 at the inside of the cooler 40 is first provided from the refrigerant supply port 45 toward an upper circumferential edge section (first circumferential section) in the Y-axis direction of the flow path formation portion 43. Next, the flow path 41 is provided from the first circumferential edge section of the flow path formation portion 43 toward a middle section in the Y-axis direction. Next, the flow path 41 is provided from the middle section of the flow path formation portion 43 toward a lower circumferential edge section (second circumferential section) in the Y-axis direction. Next, the flow path 41 is provided from the second circumferential edge section of the flow path formation portion 43 toward the refrigerant discharge port 47.

As shown in FIG. 4, in the cooler 10 of the embodiment, a temperature distribution in the Y-axis direction is uniformized. On the other hand, in the cooler 40 of the comparison example, it is found that a temperature distribution in the Y-axis direction is non-uniform and the cooling effect in the Y-axis direction is biased. In the cooler 40 of the comparison example, the temperature varies so as to increase toward the second end portion side in the Y-axis direction where the flow path length from the refrigerant supply port 45 is relatively long from the first end portion side in the Y-axis direction where the flow path length from the refrigerant supply port 45 is relatively short. As compared to the cooler 40 of the comparison example, in the cooler 10 of the embodiment, the difference in flow path lengths from the refrigerant supply port 45 at the first end side and the second end side in the Y-axis direction is small, and the temperatures are substantially identical.

In this way, the flow path 21 described above includes a plurality of retention portions 35 in which the flow path cross-sectional area changes so as to promote retention of the refrigerant locally. Therefore, it is possible to improve the cooling capability of the cooler 40 while preventing the size of the cooler 40 from increasing and preventing the abnormality of the cooler 40 by the increase of the flow velocity of the refrigerant at the inside of the flow path 21.

That is, the retention time of the refrigerant at each retention portion 35 is longer than the retention time of the refrigerant at each straight-line-shape portion 31 in the flow direction of the refrigerant. Thereby, it is possible to extend the retention time of the refrigerant in the flow path 21, for example, as compared to a case where the retention portion 35 is not provided. Therefore, it is possible to improve the cooling capability of the cooler 40 while preventing the size of the cooler 40 from increasing and preventing the increase of the flow velocity of the refrigerant at the inside of the flow path 21.

In any two straight-line-shape portions 31 adjacent in the Y-axis direction, the distance between one straight-line-shape portion 31 and the retention portion 35 is smaller than the distance between two straight-line-shape portions 31. Thereby, it is possible to promote heat transfer between the refrigerants flowing through any two adjacent straight-line-shape portions 31 and improve uniformity of the temperature, for example, as compared to a case where the retention portion 35 is not provided.

The plurality of retention portions 35 are provided locally in the flow path 21, and thereby, it is possible to prevent an increase of a pump capacity, for example, as compared to a case where the flow path cross-sectional area is enlarged throughout the entire flow path 21.

Each retention portion 35 overlaps the cooling target object OB when seen from the normal direction of the contact surface 37, and thereby, it is possible to promote cooling of the cooling target object OB. For example, it is possible to promote cooling of the cooling target object OB by the refrigerant as compared to a case where each retention portion 35 does not overlap the cooling target object OB when seen from the normal direction of the contact surface 37.

The plurality of retention portions 35 provided in any two straight-line-shape portions 31 adjacent in the Y-axis direction are arranged in a staggered arrangement when seen from the Z-axis direction, and thereby, it is possible to ensure uniform heat transfer in the entire cooler 10. For example, it is possible to prevent the cooling effect from being biased depending on the position as compared to a case where the plurality of retention portions 35 are locally proximate to each other such as a case where the plurality of retention portions 35 are aligned in the Y-axis direction when seen from the Z-axis direction.

In a direction from the refrigerant supply port 23 to the refrigerant discharge port 25, the flow path 21 is provided from the middle section toward the circumferential edge section in the Y-axis direction of the flow path formation portion 11, and thereby, it is possible to uniformize the temperature distribution in the Y-axis direction of the cooler 10. For example, as compared to a case where the flow path 41 is provided toward the second end portion side from the first end portion side in the Y-axis direction of the flow path formation portion 43 as in the comparison example, it is possible to prevent the temperature distribution in the Y-axis direction from being non-uniform and prevent the cooling effect in the Y-axis direction from being biased.

Hereinafter, a modification example is described.

The above embodiment is described using an example in which the flow path 21 reciprocates along the X-axis direction a plurality of times between both end portions in the X-axis direction of the flow path formation portion 11; however, the embodiment is not limited thereto.

Figure 5:
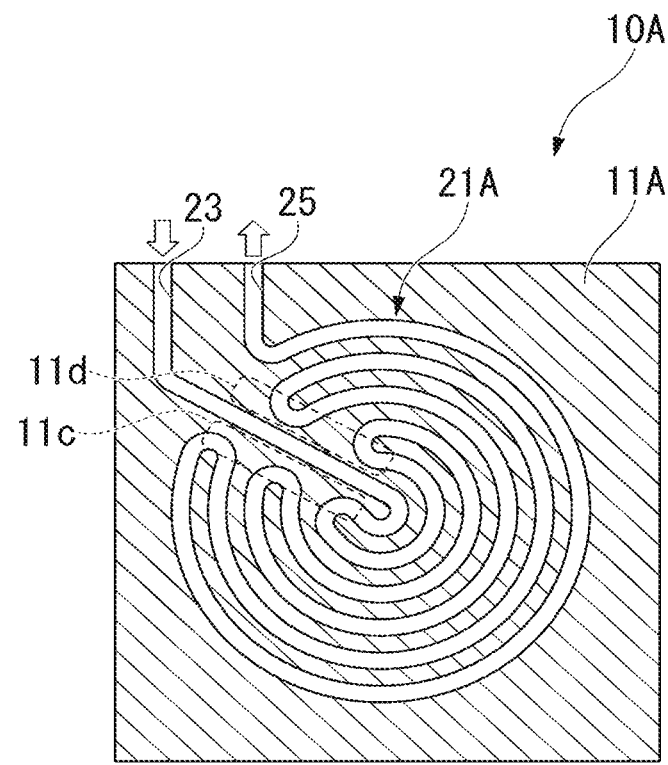
FIG. 5 is a cross-sectional view of a cooler according to a modification example of the embodiment.

FIG. 5 is a cross-sectional view of a cooler 10A according to a modification example of the embodiment.

As shown in FIG. 5, a flow path 21A formed in a flow path formation portion 11A of the cooler 10A of the modification example reciprocates, for example, along a circumferential direction a plurality of times between predetermined two sections 11c and 11d in the circumferential direction. The flow path 21A of the modification example is provided toward an outer circumferential portion from an inner circumferential portion while meandering along the circumferential direction between the predetermined two sections 11c and 11d of the flow path formation portion 11A.

Figure 6:
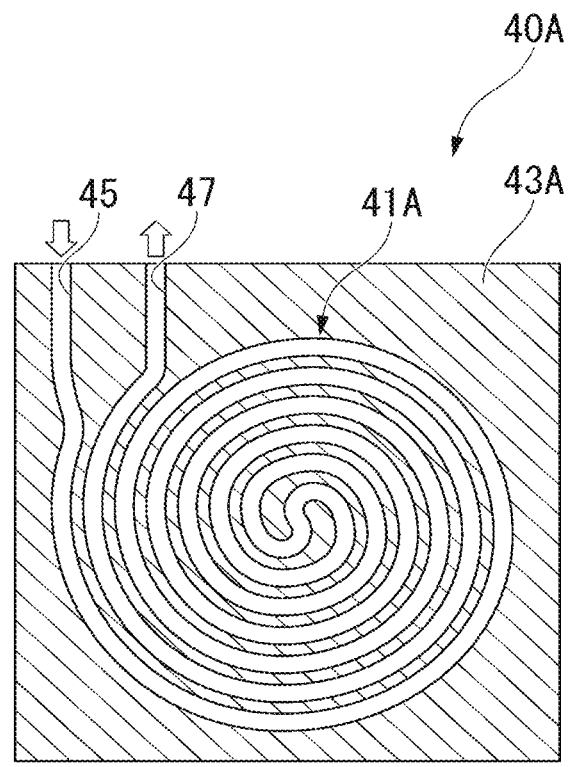
FIG. 6 is a cross-sectional view of a cooler according to a comparison example of the modification example of the embodiment.

FIG. 6 is a cross-sectional view of a cooler 40A according to a comparison example of the modification example of the embodiment.

As shown in FIG. 6, a flow path 41A formed in a flow path formation portion 43A of the cooler 40A according to the comparison example of the modification example circles, for example, along the circumferential direction a plurality of times in a spiral form. The flow path 41A of the comparison example of the modification example is directed toward an inner circumferential portion from an outer circumferential portion of the flow path formation portion 43A while swirling along one circumferential direction (a first direction) and then turns around. Then, the flow path 41A is provided to be directed toward the outer circumferential portion from the inner circumferential portion while swirling along an opposite direction (a second direction) of the one circumferential direction.

In the cooler 40A of the comparison example of the modification example, an outward section directed toward the inner circumferential portion from the outer circumferential portion and a return section directed toward the outer circumferential portion from the inner circumferential portion are adjacent to each other in a radial direction, and thereby, there is a concern that cooling by the refrigerant may not efficiently act on the cooling target object OB. On the other hand, in the cooler 10A of the modification example, a temperature distribution in which the temperature gradually changes from the inner circumferential portion having a relatively strong cooling effect toward the outer circumferential portion having a relatively small cooling effect is obtained, and the cooling by the refrigerant efficiently acts on the cooling target object OB.

The retention portion 35 by which a flow path cross-sectional area is changed so as to promote retention of the refrigerant locally may be provided in the flow path 21A of the cooler 10A according to the modification example of the embodiment, similarly to the cooler 10 of the embodiment.

According to at least one embodiment described above, the flow path 21 includes a plurality of retention portions 35 by which the flow path cross-sectional area is changed so as to promote retention of the refrigerant locally, and thereby, it is possible to improve the cooling capacity of the cooler 40. As a result, it is possible to prevent the size of the cooler 40 from increasing and prevent the abnormality of the cooler 40 by the increase of the flow velocity of the refrigerant at the inside of the flow path 21.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

1 Electric apparatus
3 Discharge resistor
5 Snubber resistor
7 Bus bar
9 Cable
10, 10A Cooler
11, 11A Flow path formation portion
21, 21A Flow path
31 Straight-line-shape portion
33 Curved portion
35 Retention portion
37 Contact surface
OB Cooling target object

The invention claimed is:

1. An electric apparatus comprising:
a plurality of cooling target objects; and
a cooler that cools the plurality of cooling target objects,
wherein the cooler includes:
a flow path formation portion which has a cuboid box shape, which is formed to be elongated in one direction when seen from a thickness direction, and in which a flow path through which a refrigerant flows is formed;
a contact surface that is provided on both side surfaces in the thickness direction of the flow path formation portion and is in contact with the plurality of cooling target objects;
a supply portion supplying the refrigerant to the flow path and a discharge portion discharging the refrigerant from the flow path which are arranged at one end side in the one direction of the flow path formation portion; and
a retention portion by which a flow path cross-sectional area changes se-as to promote retention of the refrigerant locally in the flow path,
the flow path meanders along the one direction and a short direction orthogonal to the one direction when seen from the thickness direction of the flow path formation portion, and includes a plurality of straight-line-shape portions that are arranged to be aligned along the one direction and a plurality of curved portions joined to both ends in the one direction of the straight-line-shape portion to reciprocate along the one direction a plurality of times between both end portions in the one direction of the flow path formation portion,
a plurality of retention portions are provided in each of the straight-line-shape portions,
the retention portions of each of the straight-line-shape portions are arranged in a staggered arrangement when seen from the thickness direction of the flow path formation portion,
the plurality of retention portions are provided to overlap the plurality of cooling target objects when seen from the thickness direction of the flow path formation portion, and
among the plurality of cooling target objects, a cooling target object having a relatively large heat generation amount is arranged closer to the supply portion and the discharge portion in the one direction than a cooling target object having a relatively small heat generation amount.

2. The electric apparatus according to claim 1,
wherein the flow path is first provided from the supply portion toward a middle section of the flow path formation portion, is then provided from the middle section toward a circumferential edge section of the flow path formation portion, and is then provided from the circumferential edge section toward the discharge portion.

* * * * *